United States Patent [19]

Ohhata et al.

[11] Patent Number: 5,402,377
[45] Date of Patent: Mar. 28, 1995

[54] SEMICONDUCTOR MEMORY DEVICE HAVING A CONTROLLED AUXILIARY DECODER

[75] Inventors: Kenichi Ohhata, Tachikawa; Hiroaki Nambu, Sagamihara; Kazuo Kanetani, Akishima; Youji Idei, Asaka; Takeshi Kusunoki, Tachikawa; Toru Masuda, Kokubunji, all of Japan

[73] Assignees: Hitachi, Ltd.; Hitachi Device Engineering Co., Ltd., both of Tokyo, Japan

[21] Appl. No.: 243,908

[22] Filed: May 17, 1994

[30] Foreign Application Priority Data

May 17, 1993 [JP] Japan ................. 5-114363

[51] Int. Cl.$^6$ ................. G11C 8/00
[52] U.S. Cl. ...:................. 365/200; 371/10.1; 371/10.2; 371/10.3; 365/230.06
[58] Field of Search ............. 365/200, 201, 230.06, 365/189.01; 371/10.1, 10.2, 10.3

[56] References Cited

U.S. PATENT DOCUMENTS

| | | | |
|---|---|---|---|
| 5,034,925 | 7/1991 | Kato | 365/200 |
| 5,255,234 | 10/1993 | Seok | 365/200 |

FOREIGN PATENT DOCUMENTS

| | | |
|---|---|---|
| 63-302499 | 9/1988 | Japan . |
| 376096 | 4/1991 | Japan . |
| 3228300 | 10/1991 | Japan . |
| 5234395 | 9/1993 | Japan . |

OTHER PUBLICATIONS

The Journal of the Institute of Electronics and Communication Engineers of Japan, Sep. 1982, pp. 1000–1002.
Transactions of the Institute of Electronics and Communication Engineers of Japan, vol. J66-C, No. 12, '83/12, pp. 935–942.

Primary Examiner—Eugene R. LaRoche
Assistant Examiner—Vu Le
Attorney, Agent, or Firm—Antonelli, Terry, Stout & Kraus

[57] ABSTRACT

A semiconductor memory device has a primary memory cell array, a primary decoder having a first circuit producing an intermediate signal from an address signal and a second circuit producing a first cell selection signal from the intermediate signal for selectively driving a word line and a bit line, an auxiliary memory cell array having a plurality of memory cells, each being used for a defective memory cell found in the primary memory cell array, an auxiliary decoder connected to the primary decoder to receive the intermediate signal, a non-volatile memory for storing first information indicating that the primary memory cell array contains a defective memory cell from which a cell defect signal is produced and for storing second information indicating an address of the defective memory cell from which a defective cell address signal is produced, and a control circuit responsive to the cell defect signal and the defective cell address signal for producing a first control signal to be supplied to the second circuit and a second control signal to be supplied to the auxiliary decoder. The primary decoder is prohibited by the first control signal from accessing a defective memory cell having an address represented by the defective cell address signal. The auxiliary decoder produces a second cell selection signal from the intermediate signal under control of the second control signal and of the cell defect signal for selectively accessing a memory cell in the auxiliary memory cell array.

7 Claims, 14 Drawing Sheets

FIG. I
PRIOR ART

F I G. 7
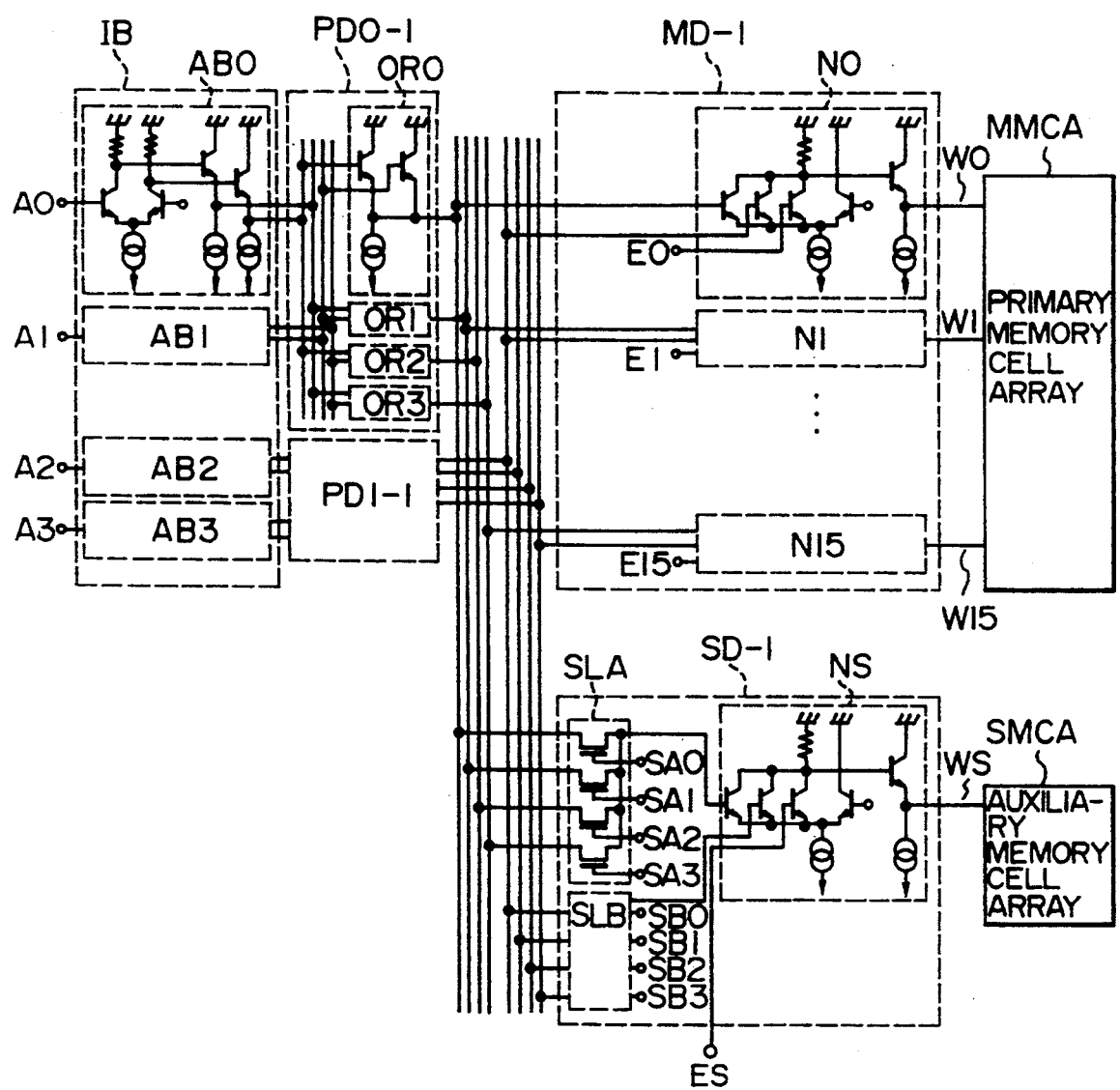

F I G. 10
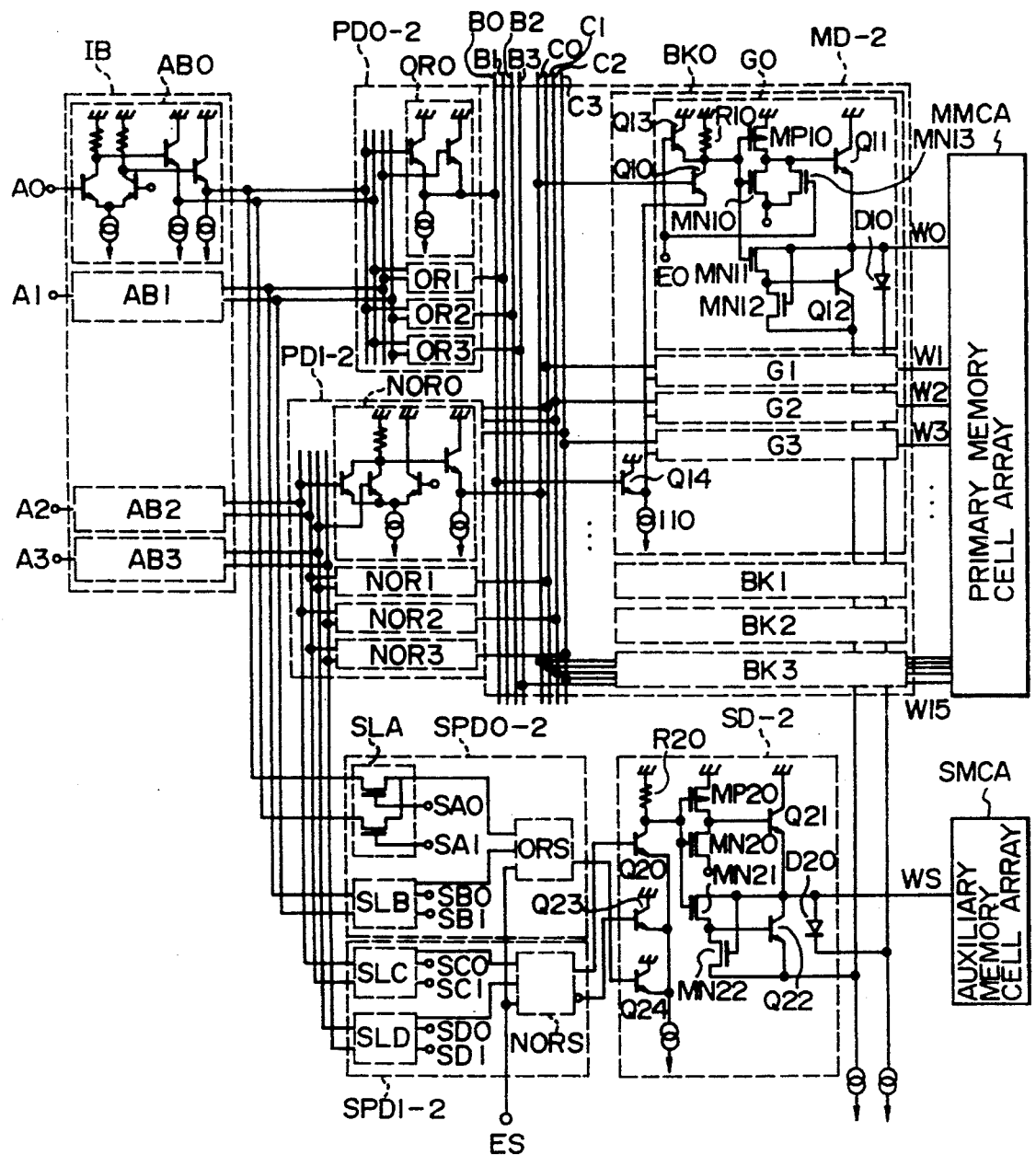

SEMICONDUCTOR MEMORY DEVICE HAVING A CONTROLLED AUXILIARY DECODER

BACKGROUND OF THE INVENTION

The present invention relates to a semiconductor memory device having a primary memory cell array, a primary decoder which produces a first cell selection signal for accessing the primary memory cell array, an auxiliary memory cell array, and an auxiliary decoder which produces a second cell selection signal for accessing the auxiliary memory cell array.

An example of the prior art concerning a remedy for defects in a semiconductor memory device is shown in FIG. 1. In the figure, reference symbol MMCA denotes a primary memory cell array, symbol SMCA an auxiliary memory cell array, and symbol P a PROM. An address (DA0-DA3) of a defective cell and the presence/absence (ES) of a defective cell are programmed in the PROM. Symbol IB denotes an input buffer, symbols PD0 and PD1 pre-decoders, symbol MD a main decoder, and symbol AC an address compare circuit. FIG. 1 shows the case where an address signal A0-A3 is decoded by the pre-decoders PD0 and PD1 and the main decoder MD to select any one of sixteen word lines W0 to W15. The pre-decoders PD0 and PD1 pre-decode the bits A0, A1 and A2, A3 of the address signal to output pre-decode signals B0-B3 and C0-C3, respectively. These pre-decode signals are further decoded by the main decoder MD to select one of the word lines W0 to W15. The main decoder MD includes NOR circuits N0 to N15. The NOR circuit has two input terminals from which the pre-decode signals are received and one control terminal to which an output signal of the address compare circuit AC is supplied.

In the case where the primary memory cell array MMCA includes no defective cell, the PROM is programmed such that the signal ES is "1". With this programming, the output of the address compare circuit AC always takes "0" to enable the main decoder MD so that the primary memory cell array MMCA is accessed. At this time, since a word line WS takes "0" the auxiliary memory cell array SMCA is not accessed.

On the other hand, in the case where the primary memory cell array MMCA includes a defective cell, for example, in the case where a memory cell connected to the word line W0 is defective, the PROM is programmed such that the signal ES is "0" and the defective cell address signal DA0-DA3 indicates an address of the defective word line or are "0000" in the case of the present example. With this programming, when the address signal A0-A3 is "0000" the output of the address compare circuit AC takes "1" to disable all the NOR circuits in the main decoder MD so that the primary memory cell array MMCA is not accessed. On the other hand, since the word line WS takes "1" at this time, the auxiliary memory cell array is accessed in lieu of the primary memory cell array. In the case where the address signal is other than "0000" the output of the address compare circuit AC takes "0" to enable the main decoder MD so that the primary memory cell array is accessed. Namely, a memory chip containing a defective cell can be remedied in such a manner that the auxiliary memory cell array is accessed in the case where an address indicating the defective cell is inputted while the primary memory cell array is accessed in the other cases.

One example of references concerning defect remedy technique for semiconductor memory devices is an article written on pp. 1000–1002 of The Journal of The Institute of Electronics and Communication Engineers of Japan, September 1982.

In the above prior art, the number of logic stages up to the word lines is 3 in the case where the primary memory cell array is accessed. On the other hand, in the case where the auxiliary memory cell array is accessed, the number of logic stages is 4 since the signal passes through the address compare circuit AC. Further, since the output of the address compare circuit AC is connected to all the second-stage decoders, a load imposed on the address compare circuit becomes very large and a delay time becomes long. Accordingly, there is an inconvenience that an access time becomes long when the auxiliary memory cell array is accessed. Therefore, the conventional defect remedy technique could not successfully be applied to a field of technique in which a high speed operation is required.

JP-A-5-234395 laid open on Sep. 10, 1993 has disclosed a defect remedy circuit for memory device provided with an address compare circuit which is formed using transfer gates.

JP-A-3-228300 laid open on Oct. 9, 1991 has disclosed a semiconductor memory circuit provided with a substitutional address judgement circuit. The substitutional address judgement circuit takes no logic combination with an internal address signal or the substitutional address judgement circuit itself determines a substitutional address, thereby making it possible to reduce a time from an external address signal to an internal selected address signal.

JP-A-63-302499 laid open on Dec. 9, 1988 corresponding to Dutch Patent Application No. 8701085 filed on 1987 has disclosed a memory device provided with a redundant decoder and a redundant memory cell array. An input signal of the redundant decoder is selected by transfer gates and fuses so that the redundant memory cell array is accessed by a selected signal portion.

SUMMARY OF THE INVENTION

An object of the present invention is to provide a semiconductor memory device in which a time for accessing an auxiliary memory cell array is not substantially elongated as compared with a time for accessing a primary memory cell array.

According to one aspect of the present invention, a semiconductor memory device has a primary memory cell array, a primary decoder having a first circuit for producing an intermediate signal from an address signal and a second circuit for producing a first cell selection signal from the intermediate signal for selectively driving one word line and at least one bit line, an auxiliary memory cell array having a plurality of memory cells, each being used for a defective memory cell found in the primary memory cell array, an auxiliary decoder connected to the primary decoder to receive the intermediate signal therefrom, a non-volatile memory for storing therein first information indicating that the primary memory cell array contains at least one defective memory cell from which a cell defect signal is produced and for storing therein second information indicating an address of the at least one defective memory cell in the primary memory cell array from which a defective cell address signal is produced, and a control circuit responsive to the cell defect signal and the defective cell address signal for producing a first control signal to be supplied to the second circuit means of the primary decoder and a second control signal to be supplied to the auxiliary decoder. The primary decoder is prohibited by the first control signal from accessing a defective memory cell having an address represented by the defective cell address signal. The auxiliary decoder produces a second cell selection signal from the intermediate signal under control of the second control signal from the control circuit and of the cell defect signal from the non-volatile memory for selectively accessing a memory cell in the auxiliary memory cell array.

According to another aspect of the present invention, a semiconductor memory device has a primary memory cell array, an auxiliary memory cell array for remedy for a defective cell in the primary memory cell array, a primary decoder for selectively driving one word line or at least one bit line e.g., a pair of bit lines, the primary decoder being provided with a control input terminal for receiving a first control signal which keeps a word line or a bit line corresponding to a defective cell in an unselected condition or keeps a block of plural word lines inclusive of the word line corresponding to the defective cell in an unselected condition or keeps a block of plural bit lines inclusive of the bit line corresponding to the defective cell in an unselected condition, an auxiliary decoder for selectively driving the auxiliary memory cell array, a switch for connecting a decode signal corresponding to the defective cell to an input terminal of the auxiliary decoder, a non-volatile memory programmed in accordance with an address of the defective cell, and a control circuit for producing the first control signal and a second control signal for control of the switch in accordance with information of the non-volatile memory.

It is preferable that the switch includes a MOS transistor.

In this case, it is preferable that the control circuit is formed by a CMOS circuit. Thereby, a power consumption can be reduced.

Also, when the switch and the control circuit are constructed as mentioned above, it is preferable that the primary decoder and the auxiliary decoder are formed by composite circuits of bipolar transistors and MOS transistors. Thereby, a high speed ability is obtained. It is further preferable that the memory cells in the primary and auxiliary memory cell arrays are formed by MOS transistors. Thereby, the area is reduced and hence a high integration is obtained.

A word line or a bit line containing a defective cell is kept in an unselected condition by the control circuit and a bit of the pre-decode signal corresponding to a defective cell address is connected through the switch to the decode input terminal of the auxiliary decoder. Namely, an access path corresponding to the defective cell address is changed from the primary decoder to the auxiliary decoder, thereby remedying the defective cell. Therefore, no address compare circuit is required. As a result, the number of logic stages up to the word lines or the bit lines in the case where the auxiliary memory cell array is accessed can be made the same as that in the case where the primary memory cell array is accessed. In the case where the auxiliary memory cell array is accessed, a delay time is increased by a transmission time when a pre-decode signal passes through the switch circuit. However, this increase is almost negligible as compared with a delay time corresponding to one logic circuit stage. Accordingly, a time for accessing the auxiliary memory cell array has little increase as compared with a time for accessing the primary memory cell array.

BRIEF DESCRIPTION OF THE DRAWINGS

FIG. 7 is a diagram showing an embodiment in which the memory device shown in FIG. 2 is realized by ECL circuits;

FIG. 10 is a diagram showing a specific example of the construction of a portion of the memory device of FIG. 3 excepting the PROM and the control circuit, the primary decoder and the auxiliary decoder being constructed to attain a low power consumption;

DESCRIPTION OF THE PREFERRED EMBODIMENTS

Figure 1:
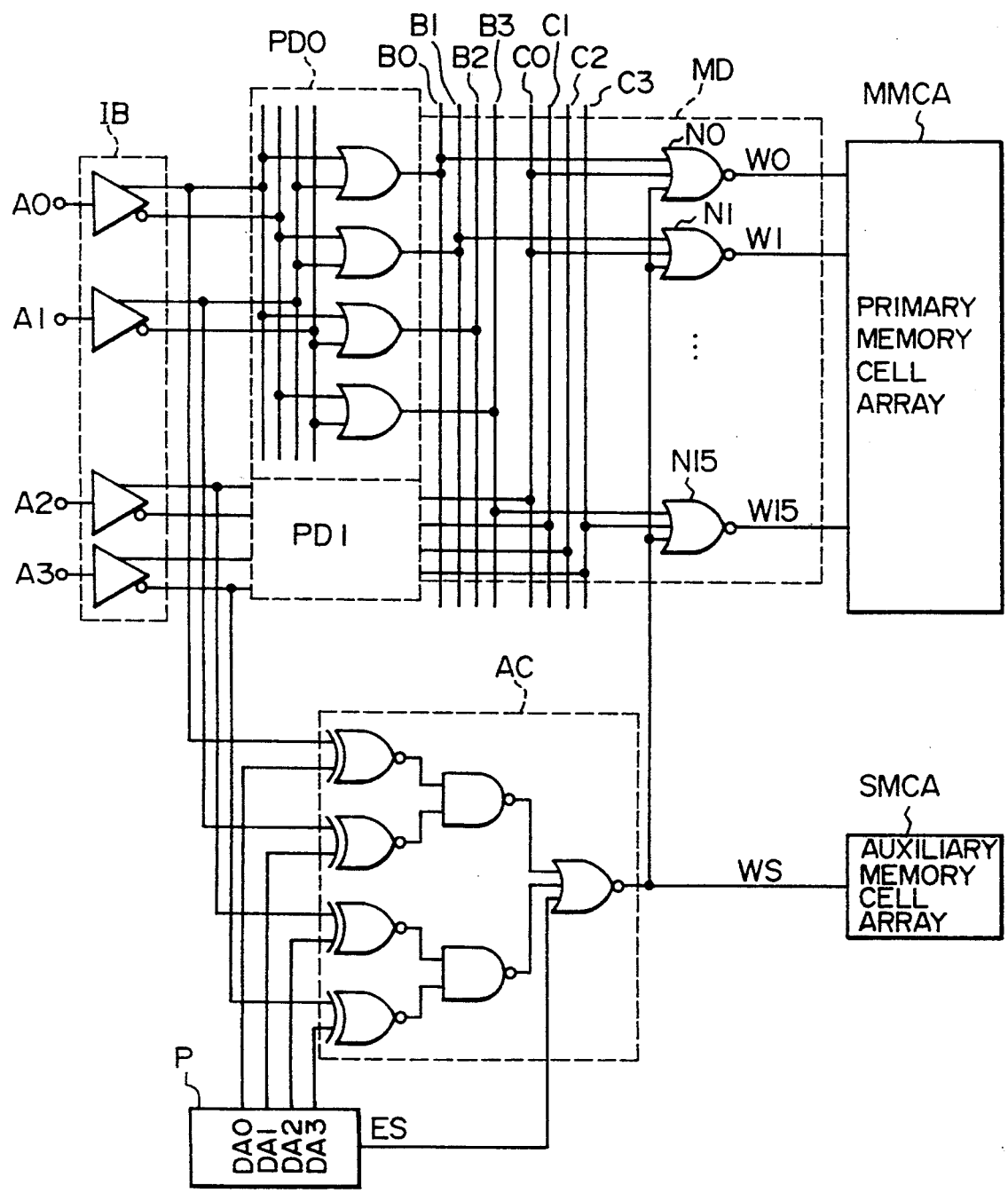
FIG. 1 is a diagram showing an example of the conventional semiconductor memory device.
Figure 2:
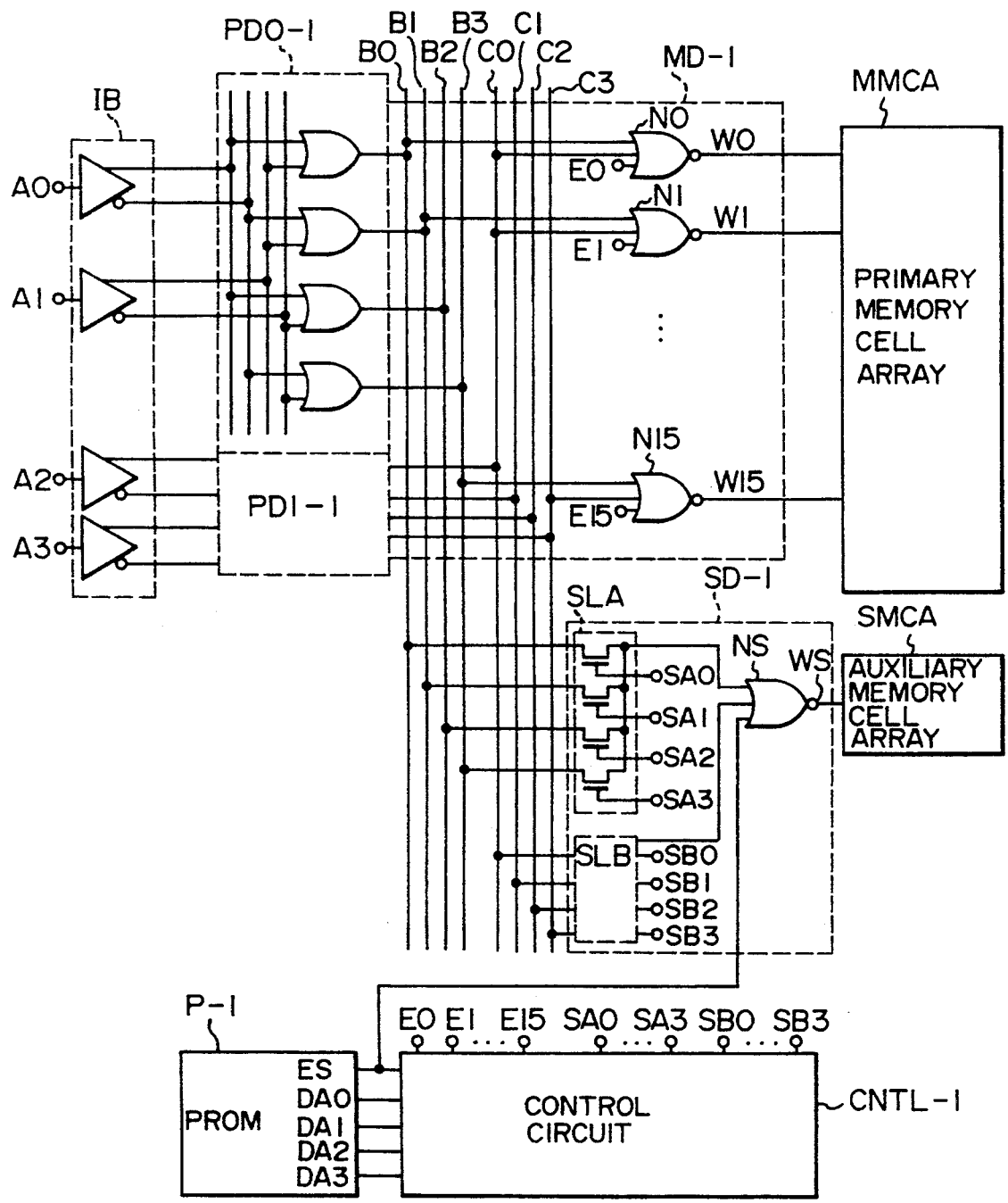
FIG. 2 is a diagram showing a semiconductor memory device according to an embodiment of the present invention.

FIG. 2 shows a first embodiment of the present invention. In FIG. 1, reference symbol MD-1 denotes a main decoder, symbol SD-1 an auxiliary decoder, symbol MMCA a primary memory cell array, symbol SMCA an auxiliary memory cell array, symbol P-1 a non-volatile memory such as a PROM, symbol CNTL-1 a control circuit, symbol IB an input buffer, and symbols PD0-1 and PD1-1 pre-decoders. The input buffer IB, the pre-decoders PD0-1 and PD1-1 and the main decoder MD-1 form a primary decoder. The construction of the input buffer IB and the pre-decoders PD0-1 and PD1-1 in the present embodiment is the same as that in the prior art. On the other hand, individual bits E0 to E15 of a first multi-bit control signal are supplied to control input terminals of NOR circuits N0 to N15 in the main decoder MD-1. The first control signals E0—

E15 is produced by the control circuit CNTL-1 in accordance with the presence/absence (ES) of a defective cell and a defective cell address (DA0-DA3). ES and DA0-DA3 are stored in the PROM. The auxiliary decoder SD-1 includes a NOR circuit NS (or auxiliary circuit means) similar to the NOR circuit of the main decoder MD-1 and includes switch circuits SLA and SLB. Bits of a first multi-bit pre-decode signal B0-B3 and C0-C3 corresponding to the defective cell address are selectively connected to input terminals of the NOR circuit NS. A second multi-bit control signal SA0-SA3 and SB0-SB3 for controlling the switch circuits SLA and SLB is also produced by the control circuit CNTL-1 in accordance with the cell defect signal ES and the defective cell address DA0-DA3. The switch circuits SLA and SLB can be formed by MOS switches. In the shown example, the switch circuit is formed by only n MOS transistors. However, p MOS transistors may be connected in parallel, as required. The defective cell address (DA0-DA3) and the presence/absence (ES) of a defective cell are programmed in the PROM P-1 in a similar manner to the prior art. Detailed examples of the control circuit will be mentioned later on. All members or components shown in FIG. 2 are formed in a single semiconductor substrate which is made of, for example, silicon.

The circuit operation of the present embodiment will now be explained in conjunction with both the case where the primary memory cell array MMCA contains a defective cell and the case where the primary memory cell array MMCA contains no defective cell.

Figure 4:
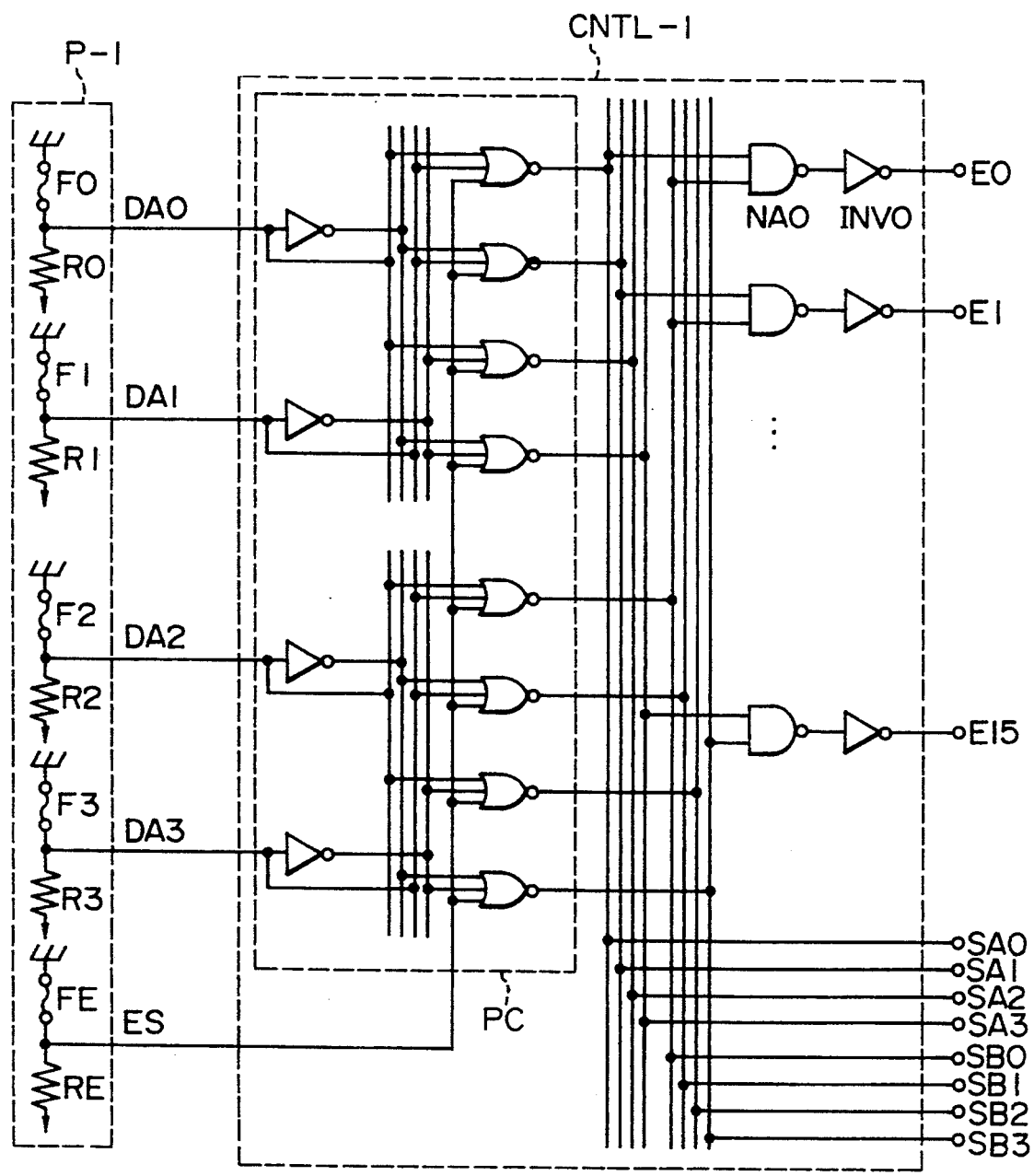
FIG. 4 is a diagram showing an example of the control circuit which may be used in the memory device shown in FIG. 2.

First, consider the case where the primary memory cell array MMCA contains no defective cell. In this case, the PROM P-1 is programmed such that the cell defect signal ES indicating the presence/absence of a defective cell is "1". Since the control circuit CNTL-1 is constructed, for example, as shown in FIG. 4, there are produced the following:

E0 to E15 = "0"
SA0 to SA3 = "0"
SB0 to SB3 = "0". Accordingly, the NOR circuits N0 to N15 in the main decoder MD-1 are all placed in enabled conditions and the NOR circuit NS in the auxiliary decoder SD-1 is placed in a disabled condition. Namely, the primary memory cell array MMCA is accessed in accordance with the address signal A0-A3 and the auxiliary memory cell array SMCA is not accessed.

Next, consider the case where the primary memory cell array MMCA contains a defective cell, for example, a memory cell connected to the word line W0 is defective (or the word line W0 is defective). In this case, the PROM P-1 is programmed such that the cell defect signal ES is "0" and the defective cell address signal DA0-DA3 indicates an address of the defective word line or is "0000" in the present example. Since the control circuit CNTL-1 is constructed, for example, as shown in FIG. 4, there are produced the following:

| E0 = "1" | E1 to E15 = "0" |
| SA0 = "1" | SA1 to SA3 = "0" |
| SB0 = "1" | SB1 to SB3 = "0". |

Thereby, the NOR circuit N0 in the main decoder MD-1 is always placed in a disabled condition and the word line W0 is kept at a low potential. On the other hand, the NOR circuit NS in the auxiliary decoder SD-1 is supplied with the bits B0 and C0 of the first multi-bit pre-decode signal (or multi-bit intermediate signal) through the switch circuits SLA and SLB. Therefore, when the address signal "0000" designating the word line W0 is inputted, the output of the NOR circuit NS in the auxiliary decoder SD-1 in lieu of the NOR circuit N0 in the main decoder MD-1 takes a high potential so that the auxiliary memory cell array SMCA is accessed.

In the present embodiment, a word line containing a defective cell is kept at a low potential by the control circuit CNTL-1 and bits of the first multi-bit pre-decode signal corresponding to a defective cell address are connected through the switches SLA and SLB to the decode input terminals of the auxiliary decoder SD-1. Namely, an access path corresponding to the defective cell address is changed from the primary decoder to the auxiliary decoder, thereby remedying the defective cell. Therefore, no address compare circuit is required. As a result, the number of logic stages up to the word lines in the case where the auxiliary memory cell array is accessed is 3 or the same as that in the case where the primary memory cell array is accessed. When the auxiliary memory cell array is accessed, a delay time is increased by a time when the first pre-decode signal transmits through the MOS transistor of the switch circuit SLA or SLB in the auxiliary decoder SD-1. However, this increase is almost negligible as compared with a delay time corresponding to one logic circuit stage. Accordingly, even in the case where the auxiliary memory cell array SMCA is accessed, the delay time has little increase.

In a field of, for example, a very high speed memory used as a cache memory in a large scale computer or a supercomputer, there may be the case where the time of transmission through the MOS switch cannot be ignored. This problem can be overcome by changing the circuit constants so that the NOR circuit NS in the auxiliary decoder SD-1 operates at a high speed as compared with the main decoder MD-1. Alternatively, if the main decoder MD-1 is formed by a CMOS or BiCMOS circuit, an increase in access time when the auxiliary memory cell array SMCA is accessed can be prevented by forming the NOR circuit NS by an ECL circuit.

Though the present embodiment has been shown in conjunction with the example of application to the word line decoder, it is of course that the application to a bit line decoder is possible in a similar manner.

Figure 3:
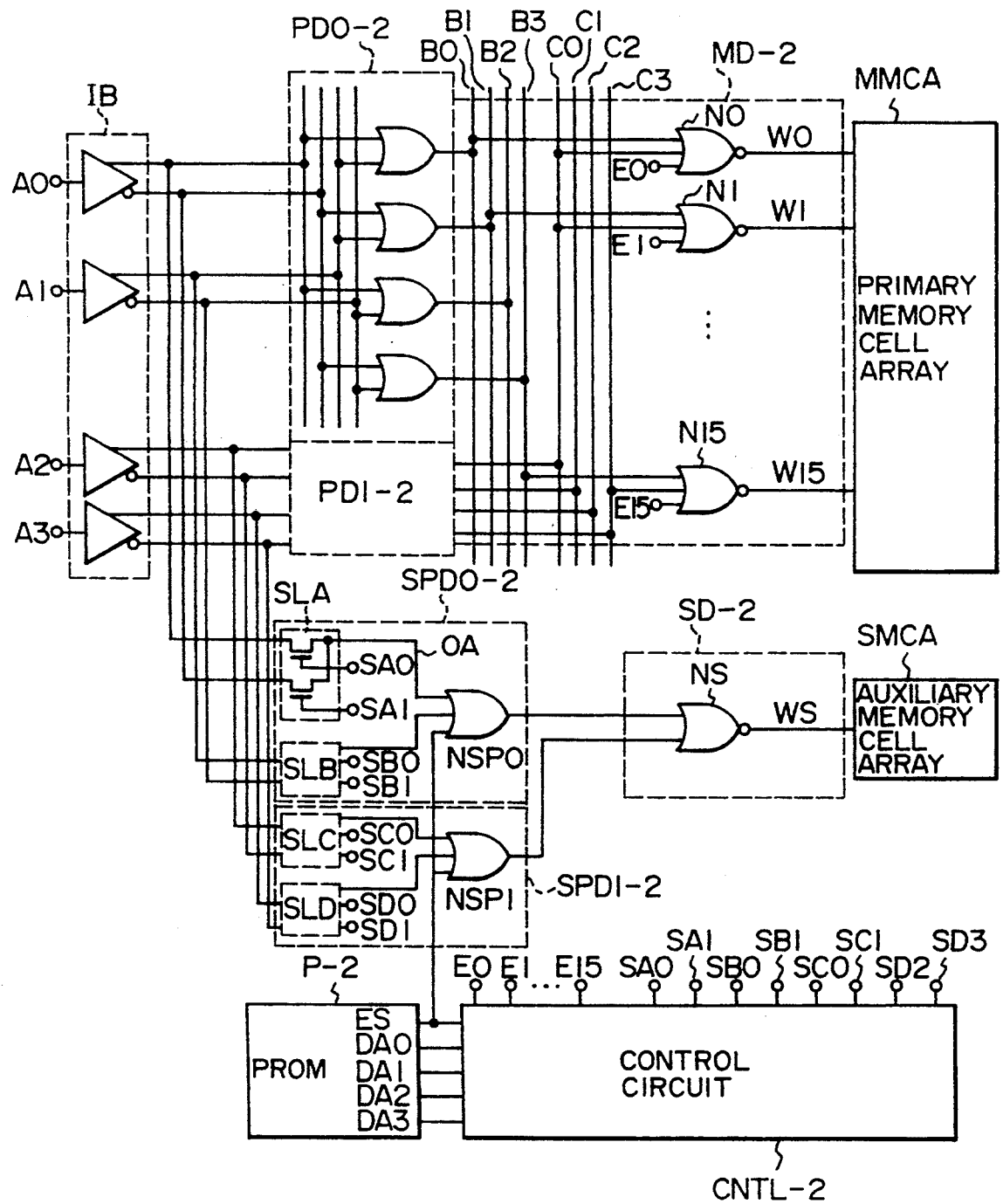
FIG. 3 is a diagram showing a semiconductor memory device according to another embodiment of the present invention.

FIG. 3 shows a second embodiment of the present invention. In the present embodiment, an auxiliary decoder includes auxiliary pre-decoders SPD0-2 and SPD1-2 for producing a second multi-bit pre-decode signal and a main decoder SD-2 for receiving the second pre-decode signal.

Reference symbols SLA, SLB, SLC and SLD denote switch circuits, and symbols SA0, SA1, SB0, SB1, SC0, SC1, SD0 and SD1 denote a second multi-bit control signal to be supplied to the switch circuits.

Figure 6:
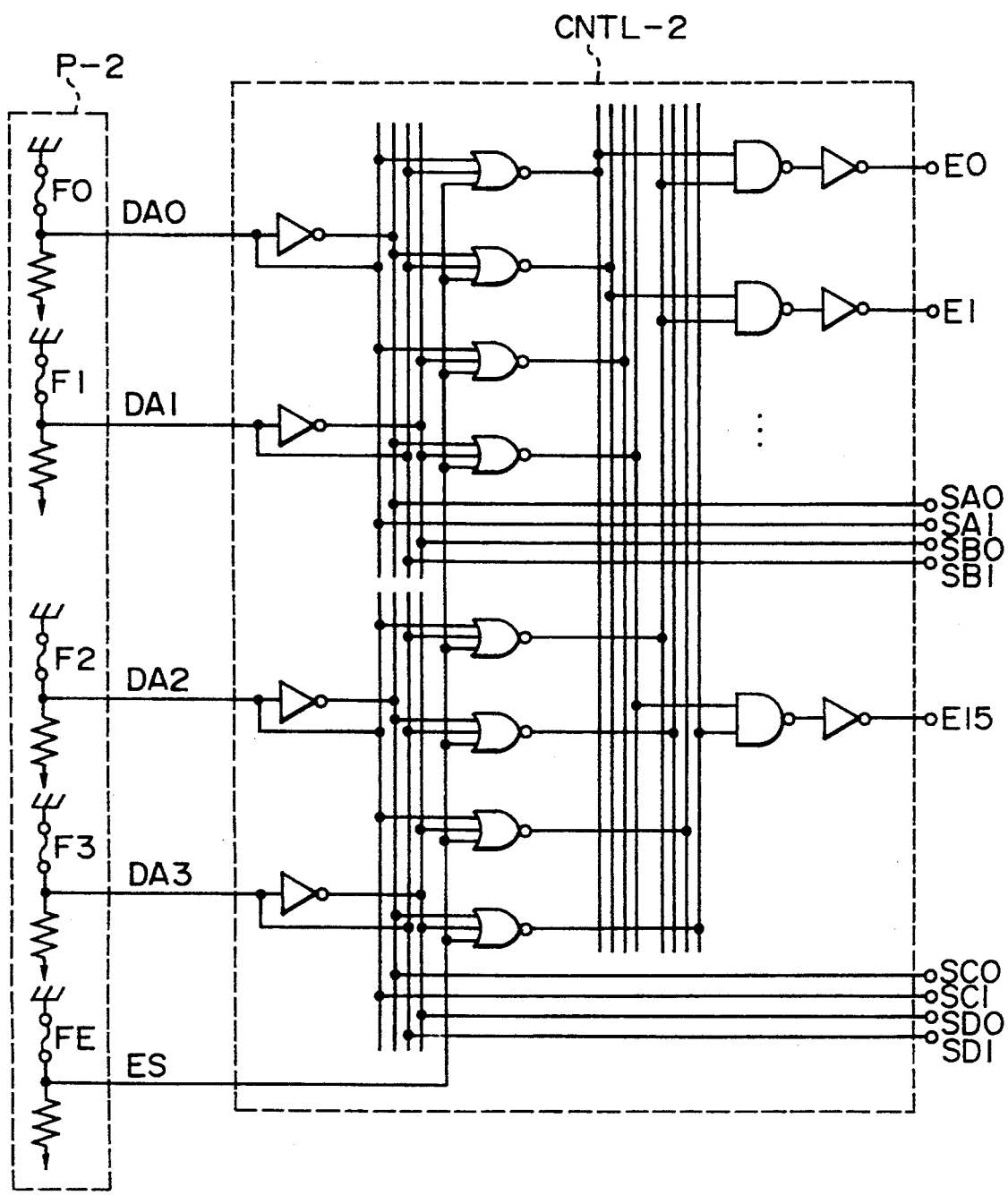
FIG. 6 is a diagram showing an example of the control circuit which may be used in the memory device shown in FIG. 3.

Consider, by way of example, the case where a memory cell connected to the word line W0 is defective (or the word line W0 is defective). In this case, a PROM P-2 is programmed such that the cell defect signal ES is "0" and the defective cell address signal DA0-DA3 indicates an address of the defective word line or is "0000" in the present example. A control circuit CNTL-2 used in the present embodiment may be constructed, for example, as shown in FIG. 6. With this construction, there are produced the following:

| | |
|---|---|
| E0 = "1" | E1 to E15 = "0" |
| SA0 = "1" | SA1 = "0" |
| SB0 = "1" | SB1 = "0" |
| SC0 = "1" | SC1 = "0" |
| SD0 = "1" | SD1 = "1". |

Thereby, a NOR circuit N0 of NOR circuits N0 to N15 forming logic gate circuits of a main decoder MD-2 in a primary decoder is always placed in a disabled condition and the word line W0 is kept at a low potential. On the other hand, an OR circuit NSP0 in the auxiliary pre-decoder SPD0-2 is supplied with the affirmative signals of bits A0 and A1 of an address signal through the switch circuits SLA and SLB, and an OR circuit NSP1 in the pre-decoder SPD1-2 in the auxiliary decoder is supplied with the affirmative signals of bits A2 and A3 of the address signal through the switch circuits SLC SLD. Therefore, when the address signal "0000" designating the word line W0 is inputted, the output of a NOR circuit NS of the main decoder SD-2 in the auxiliary decoder in lieu of the NOR circuit N0 of the main decoder MD-2 in the primary decoder takes a high potential so that the auxiliary memory cell array SMCA is accessed. The OR circuits NSP0 and NSP1 and the NOR circuit NS form auxiliary circuit means.

According to the present embodiment, a time for access to the auxiliary memory cell array can be made shorter than that in the embodiment shown in FIG. 2. Namely, a delay time of the switch circuit SLA is proportional to a product of the ON resistance of a MOS transistor forming this switch circuit and the parasitic capacitance of an output terminal (OA) of the switch circuit. Accordingly, as the number of input terminals of the switch circuit or the number of MOS transistors forming the switch circuit is smaller, the delay time becomes shorter since the parasitic capacitance of the output terminal becomes small. Though the number of input terminals of the switch circuit in the embodiment shown in FIG. 2 is 4, that in the present embodiment is 2. As a result, the time for access to the auxiliary memory cell array in the present embodiment can be made short as compared with the embodiment shown in FIG. 2. In a field in which a very high speed operation is required, it is therefore preferable that the construction of the present embodiment is used.

FIG. 4 shows an example of the PROM P-1 and the control circuit CNTL-1 which may be used in the embodiment shown in FIG. 2. The PROM P-1 includes fuses F0 to F3 and FE and resistors R0 to R3 and RE. An end of the resistor is connected to the low potential side, and the value of the resistor is set such that it is made larger than the resistance value of the fuse and large noises are not generated. Thereby, the output of the PROM takes "1" in a state in which the fuse is connected. On the other hand, if the fuse is cut off, the output of the PROM takes "0". Reference symbols DA0 to DA3 denote a multi-bit address signal (4 bits in the shown example) indicating the address of a defective cell, and symbol ES denotes a signal indicating the presence/absence of a defective cell. As shown in FIG. 4, the control circuit CNTL-1 is constructed such that it receives the cell defect signal ES and the defective cell address signal DA0-DA3 from the PROM P-1 to produce a first multi-bit control signal E0-E15 to be supplied to the main decoder MD-1 in the primary decoder and a second multi-bit control signal SA0-SA3 and SB0-SB3 to be supplied to the auxiliary decoder SD-1 (or a main decoder in the auxiliary decoder). The first control signal E0-E15 is a signal for bringing a NOR circuit (N0 in FIG. 2) of the main decoder MD-1 in the primary decoder, which supplies a first cell selection signal to a defective word line (W0 in FIG. 2), into a disabled condition. The second control signal SA0-SA3 and SB0-SB3 is a signal for taking, those bits (bits B0 and C0 in FIG. 2) of a first multi-bit pre-decode signal (or multi-bit intermediate signal) to be supplied from the pre-decoders PD0-1 and PD1-1 to the main decoder MD-1 in the primary decoder shown in FIG. 2 which select the defective word line, into the auxiliary decoder SD-1. Though no particular restriction is imposed, it is preferable that the control circuit CNTL-1 is formed by a CMOS circuit. Since the defective cell address signal DA0-DA3 and the cell defect signal ES from the PROM P-1 are DC signals, no problem is provided even if the operating speed of circuits forming the control circuit CNTL-1 is low. Accordingly, if the control circuit CNTL-1 is formed by a CMOS circuit, it is possible to make the power consumption of the control circuit as well as the occupation area thereof very small.

Figure 5:
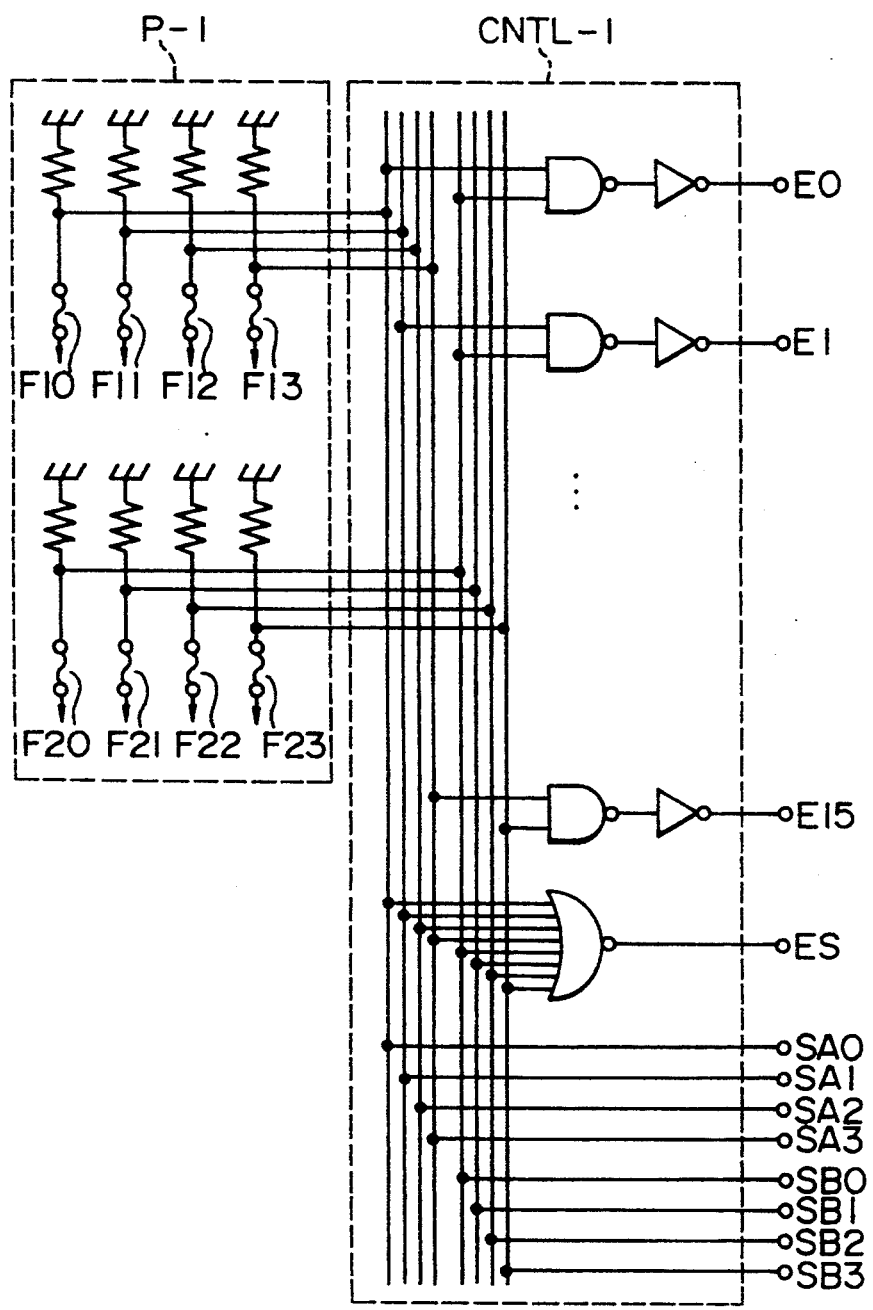
FIG. 5 is a diagram showing another example of the control circuit which may be used in the memory device shown in FIG. 2.

FIG. 5 shows another example of the PROM P-1 and the control circuit CNTL-1 which may be used in the embodiment shown in FIG. 2. In the present embodiment, a circuit portion PC of the embodiment shown in FIG. 4 is eliminated to simplify the control circuit CNTL-1. In the embodiment shown in FIG. 4, the second control signal SA0-SA3 and SB0-SB3 is produced by the circuit portion PC of the control circuit CNTL-1. On the other hand, in the present embodiment in which this circuit portion PC is eliminated, the second control signal is produced directly from the output of the PROM P-1.

In the case where there is no defective cell, none of fuses F10 to F13 and F20 to F23 are cut off. Since the fuse in the present embodiment is connected to the low potential side, the output of the PROM takes a low potential "0" in a state in which the fuse is connected. Accordingly, there are produced the following:

SA0 to SA3 = "0"
SB0 to SB3 = "0"
E0 to E15 = "0"
ES = "1". Therefore, the main decoder MD-1 is placed in an enabled condition and the auxiliary decoder SD-1 is placed in a disabled condition. Namely, the primary memory cell array MMCA is accessed in accordance with an address signal and the auxiliary memory cell array SMCA is not accessed.

On the other hand, consider the case the case where there is a defective cell, for example, a memory cell connected to a word line W0 is defective. In this case, the fuses F10 and F20 are cut off. Thus, there are produced the following:

| | |
|---|---|
| SA0 = "1" | SA1 to SA3 = "1" |
| SB0 = "1" | SB1 to SB3 = "0" |
| E0 = "1" | E1 to E15 = "0" |
| ES = "0". | |

Thereby, the word line W0 is kept in an unselected condition (or at a low potential) so that a word line WS of auxiliary memory cell array is selected in lieu of the word line W0. As has been explained in the foregoing, the control circuit can be realized even with the construction in the present embodiment.

FIG. 6 shows an example of the PROM P-2 and the control circuit CNTL-2 which may be used in the embodiment shown in FIG. 3. The construction of the PROM P-2 in the present embodiment is the same as that of the PROM P-1 shown in FIG. 4. Reference symbols DA0 to DA3 denote a multi-bit address signal (4 bits in the shown example) indicating the address of a defective cell, and symbol ES denotes a signal indicating the presence/absence of a defective cell. As shown in FIG. 6, the control circuit CNTL-2 is constructed such that it receives the cell defect signal ES and the defective cell address signal DA0-DA3 from the PROM P-2 to produce a first multi-bit control signal E0-E15 to be supplied to the main decoder MD-2 in the primary decoder and a second multi-bit control signal SA0, SA1, SB0, SB1, SC0, SC1, SD0 and SD1 to be supplied to the pre-decoders SPD0-2 and SPD1-2 in the auxiliary decoder (or the auxiliary pre-decoders). The first control signal E0-E15 is a signal for bringing a NOR circuit (N0 in FIG. 3) of the main decoder MD-2 in the primary decoder, which supplies a selection signal to a defective word line (W0 in FIG. 3), into a disabled condition. The second control signal SA0, SA1, SB0, SB1, SC0, SC1, SD0 and SD1 is a signal for taking, those of complementary signals for respective bits of an address signal to be supplied from the input buffer IB to the pre-decoders PD0-2 and PD1-2 in the primary decoder shown in FIG. 3 (or the affirmative signals of respective bits of the address signal in FIG. 3) which select the defective word line, into the pre-decoders SPD0-2 and SPD1-2 in the auxiliary decoder. From the same reasons as mentioned in conjunction with the embodiment shown in FIG. 4, it is preferable that the control circuit CNTL-2 is formed by a CMOS circuit. With this construction, it is possible to make the power consumption of the control circuit CNTL-2 as well as the occupation area thereof very small. Also, the construction of the control circuit CNTL-2 can be simplified in a manner similar to the embodiment shown in FIG. 5.

FIG. 7 shows an example in which the embodiment shown in FIG. 2 is realized using ECL circuits as fundamental elements. The input buffer IB is formed by one-input ECL circuits AB0 to AB3 to produce affirmative and negative signals of individual bits of an address signal A0-A3. Each of the pre-decoders PD0-1 and PD1-1 is formed by wired-OR circuits OR0 to OR3. Each NOR circuit in the main decoder MD-1 is formed by a three-input ECL circuit. The NOR circuit has two input terminals to which two bits of the first multi-bit pre-decode signal are supplied and one control input terminal to which one bit (E0 or the like) of the first multi-bit control signal is supplied. Like the main decoder MD-1 in the primary decoder, the auxiliary decoder SD-1 is formed by a three-input ECL circuit. This ECL circuit has two input terminals to which two bits of the first multi-bit pre-decode signal are selectively supplied through the switch circuits SLA and SLB controlled by the second control signal SA0-SA3 and SB0-SB3 and one control input terminal to which the cell defect signal ES is supplied. The primary memory cell array and the auxiliary memory cell array, which are suitable for use in combination with the present embodiment, may include bipolar memory cells as described by Transactions of the Institute of Electronics and Communication Engineers of Japan, Vol. J66-G, No. 12, December 1983, pp. 935–942 or low power supply voltage type CMOS memory cells as described by JP-A-3-76096 laid open on Apr. 2, 1991.

Figure 8:
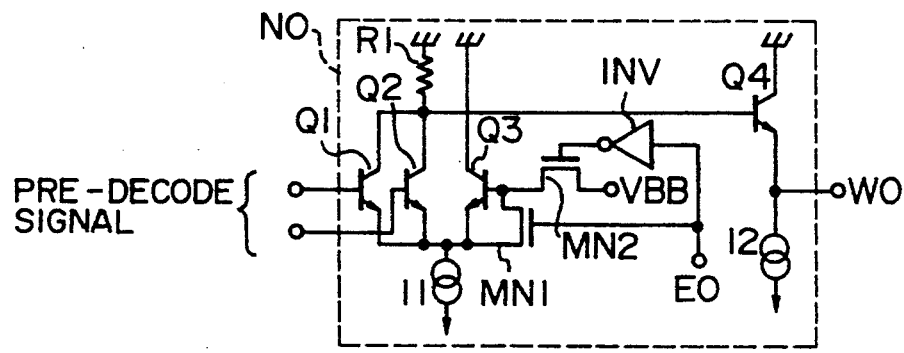
FIG. 8 is a diagram showing another construction of the primary decoder in the memory device shown in FIG. 7.

FIG. 8 shows another example of the NOR circuit (N0 or the like) of the main decoder MD-1 shown in FIG. 7. The circuit of this example includes a two-input ECL NOR circuit which is composed of bipolar transistors Q1 to Q4, current sources I1 and I2 and a resistor R1 and a switch circuit which is composed of MOS transistors MN1 and MN2 and an inverter INV for controlling the base potential of the transistor Q3. In the case where the first control signal E0 is "0" (or in an enabled condition), the MOS transistor MN2 is turned on to supply VBB to the base of the transistor Q3 so that a change-over between the selection and non-selection of the word line W0 is made in accordance with the pre-decode signal. On the other hand, in the case where the control signal E0 is "1" (or in a disabled condition), the MOS transistor MN1 is turned on to short-circuit the base and the emitter of the transistor Q3 so that the word line W0 is kept at a low potential irrespective of the pre-decode signal. The NOR circuit in the present embodiment can be constructed with two inputs. Therefore, a high speed operation can be expected as compared with the NOR circuit shown in FIG. 7.

Figure 9:
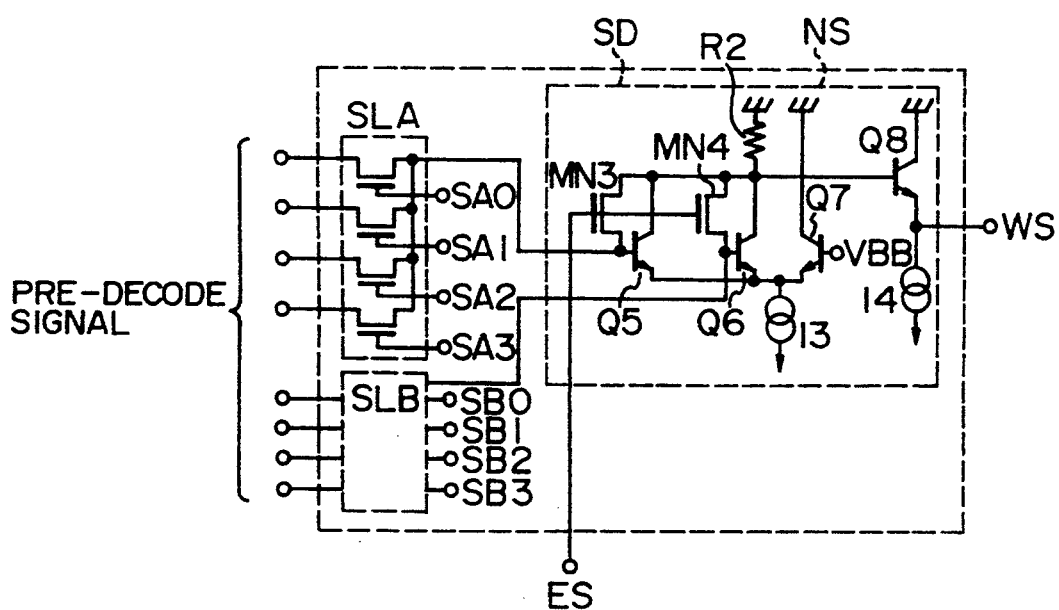
FIG. 9 is a diagram showing another construction of the auxiliary decoder in the memory device shown in FIG. 7.

FIG. 9 shows another example of the NOR circuit NS of the auxiliary decoder SD-1 shown in FIG. 7. The circuit of this example includes a two-input ECL NOR circuit which is composed of bipolar transistors Q5 to Q8, current sources I3 and I4 and a resistor R2, and a switch circuit which is composed of MOS transistors MN3 and MN4 for controlling the base potentials of the transistors Q5 and Q6. In the case where the cell defect signal ES is "0" (or in an enabled condition), the MOS transistors MN3 and MN4 are turned off to supply the pre-decode signal through the switch circuits SLA and SLB to the bases of the transistors Q5 and Q6 so that a change-over between the selection and non-selection of the word line WS is made in accordance with the pre-decode signal. On the other hand, in the case where the cell defect signal ES is "1" (or in a disabled condition), the MOS transistors MN3 and MN4 are turned on to short-circuit the base and the collector of each of the transistors Q5 and Q6 so that the word line WS is kept at a low potential irrespective of the pre-decode signal. The NOR circuit in the present embodiment can be constructed with two inputs. Therefore, a high speed operation can be expected as compared with the NOR circuit shown in FIG. 7.

The embodiments of the main decoder and the auxiliary decoder using the ECL circuit construction have been shown in the foregoing. A high speed ability can be obtained by forming those decoders by composite circuits of bipolar transistors and MOS transistors. Also, it is of course that the circuit may be formed by a CMOS circuit or a BiCMOS circuit.

A decoder circuit having a small power consumption may include one disclosed by U.S. application Ser. No. 08/149936 filed on Nov. 10, 1993 and based on JP-A-4-318161.

FIG. 10 shows an example in which the above-mentioned decoder circuit is applied in the embodiment shown in FIG. 3. In the following, the construction and operation of the decoder itself will be explained briefly and thereafter the explanation will be made of the construction and operation in the case where the decoder is applied to the present embodiment.

A primary decoder includes an input buffer IB, pre-decoders PD0-2 and PD1-2, and a main decoder MD-2. Reference symbol MMCA denotes a primary memory cell array. An auxiliary decoder includes pre-decoders SPD0-2 and SPD1-2 and a main decoder SD-2. The pre-decoder PD0-2 is formed by OR circuits OR0 to OR3. Only one bit of four pre-decode signal bits B0 to B3 has a low potential and each of the three remaining bits has a high potential. The pre-decoder PD1-2 is formed by NOR circuits NOR0 to NOR3. Only one bit of four pre-decode signal bits C0 to C3 has a high potential and each of the three remaining bits has a low potential. The main decoder MD-2 in the primary decoder includes four blocks BK0 to BK3 each of which has four decoders G0 to G3. The decoder G0 is composed of a decode portion which includes a bipolar transistor Q10 and a resistor R10, and a BiCMOS driver portion which includes MOS transistors MP10, MN10, MN11 and MN12, bipolar transistors Q11 and Q12, and a diode D10. The emitter of the bipolar transistor Q10 in the decoder G0 to G3 and the emitter of a bipolar transistor Q14 are connected to a current source I10 to form a current switch. The base of the transistor Q14 is connected to the bit B0 of the first pre-decode signal, and the bases of the transistors Q10 in the decoders G0 to G3 are connected to the bits C0 to C3 of the first pre-decode signal, respectively.

The bits B0 to B3 of the first pre-decode signal represent one of the blocks BK0 to BK3 to be selected, and the bits C0 to C3 of the first pre-decode signal represent one of the decoders G0 to G3 to be selected. For example, when the bit B0 becomes a low potential, the block BK0 is selected. At this time, if the bit C0 has a high potential, the decoder G0 is selected to flow a current through the transistor Q10 so that the collector potential of the transistor Q10 becomes low. This collector potential is inverted by the BiCMOS driver (or inverter) to bring the word line W0 into a high potential condition (or selected condition). In the present embodiment, the four decoders G0 to G3 use the current source I10 in common so that a current flows through one decoder in a selected condition and no current flows through the three remaining decoders. Accordingly, it is possible to reduce the power consumption as compared with a current source is provided in each decoder as in the embodiment shown in FIG. 7.

Next, explanation will be made of the construction and operation in the case where the above decoder circuit is applied to the present embodiment. Circuits added as a defect remedy circuit include the pre-decoders SPD0-2 and SPD1-2 in the auxiliary decoder, the main decoder SD-2 in the auxiliary decoder, an auxiliary memory cell array SMCA, a bipolar transistor Q13 and a MOS transistor MN13.

Like the pre-decoders PD0-2 and PD1-2 in the primary decoder, the pre-decoders SPD0-2 and SPD1-2 in the auxiliary decoder include an OR circuit ORS and a NOR circuit NORS. The pre-decoders SPD0-2 and SPD1-2 further include switch circuits SLA, SLB, SLC and SLD for making change-over of inputs to the OR circuit ORS and the NOR circuit NORS. Like the main decoder MD-2 in the primary decoder, the main decoder SD-2 in the auxiliary decoder is composed of a decode portion which includes transistors Q20, Q23 and Q24 and a resistor R20, and a BiCMOS driver portion which includes MOS transistors MP20, MN20, MN21 and MN22, bipolar transistors Q21 and Q22, and a diode D20. The auxiliary memory cell array SMCA can be accessed corresponding to any address by the second control signal SA0, SA1, SB0, SB1, SC0, SC1, SD0 and SD1 supplied to the switch circuits.

The transistors Q13 and MN13 has a function of keeping the word line W0 in an unselected condition (or low potential condition) when the first control signal E0 is "1". Since the "1" state of the first control signal E0 corresponds to 0 V, the collector of the transistor Q10 is clamped by the transistor Q13 irrespective of any change-over of the first pre-decode signal so that it does not become lower than −VBE (VBE: a voltage between the base and the emitter which is about 0.8 V). Therefore, the output of the BiCMOS inverter is kept at a low potential.

In the case where the threshold voltage of the p MOS transistor is not smaller than −0.8 V, there is a fear that the p MOS transistor becomes weakly conductive so that the output of the BiCMOS inverter does not take the complete low-potential condition. This can be avoided by connecting the n MOS transistor MN13 to the drain of the p MOS transistor MP10, as shown in FIG. 10. Namely, when the first control signal E0 becomes a high potential, the MOS transistor MN13 is turned on, thereby making it possible to keep the output of the inverter completely in the low potential.

As means for clamping the collector of the transistor Q10 may be used a p MOS transistor in lieu of the bipolar transistor Q13. In this case, however, it is necessary to supply an inverted version of the control signal E0 to the gate of the p MOS transistor. With the gate width of the p MOS transistor being increased, the collector potential of the transistor Q10 can be clamped at a potential higher than −0.8 V. However, if the gate width of the p MOS transistor is made too large, there may be a fear that the operating speed is deteriorated since a parasitic capacitance is increased. Therefore, it is preferable that the bipolar transistor and the p MOS transistor are properly used as the clamping means in accordance with the characteristics of the transistors.

As has been mentioned, a memory having a defect remedy function and a low power consumption can be realized according to the present embodiment.

Figure 11:
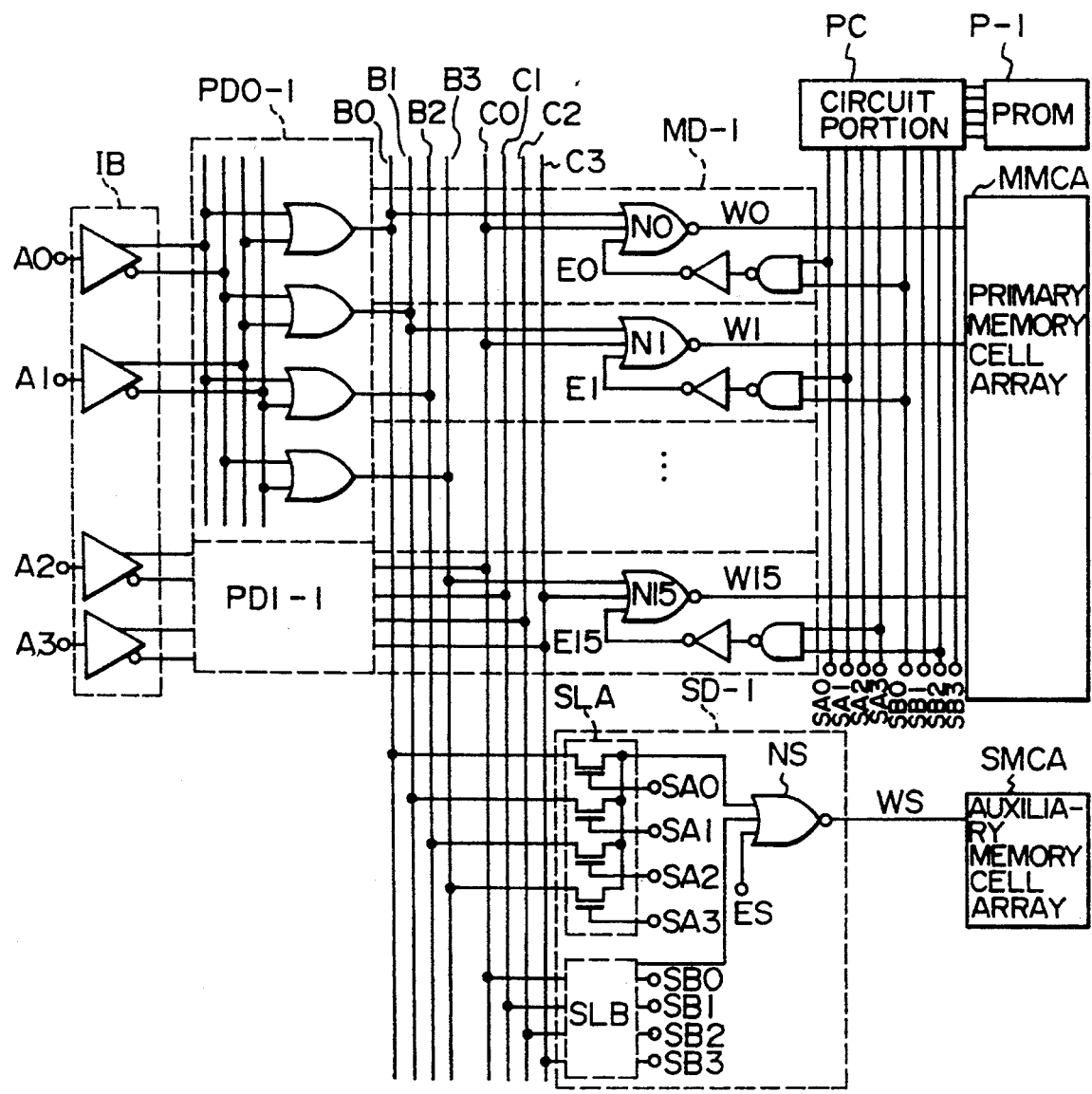
FIG. 11 is a diagram showing a semiconductor memory device according to a further embodiment of the present invention.

FIG. 11 shows an embodiment in which the embodiments shown in FIGS. 2 and 4 are modified with a circuit arrangement on a memory chip being taken into consideration in order to make the occupation area small. In the present embodiment, a portion of the control circuit CNTL-1 of FIG. 4 including NA0 and INV0 is arranged in the main decoder MD-1 and the remaining circuit portion PC is arranged outside the main decoder MD-1. Also, the wirings of the output SA0-SA3 and SB0-SB3 of the circuit portion PC are arranged along the main decoder. With such an arrangement, since the number of wirings arranged along the main decoder can be reduced, it is possible to decrease the area of the memory chip. Also, since circuits such as NA0 and INV0 can be formed by CMOS circuits, as has been explained earlier, an increase in area of the primary decoder is very small even with such a construction.

It is of course that the above circuit arrangement is not limited to the embodiment shown in FIG. 2 and is applicable to all the foregoing embodiments.

One of defects frequently generated in semiconductor memories is originated from the short-circuiting of adjacent word lines or bit lines. In this case, two word lines (or bit lines) become defective in pair. This defect can be remedied by an embodiment shown in FIG. 12.

Figure 12:
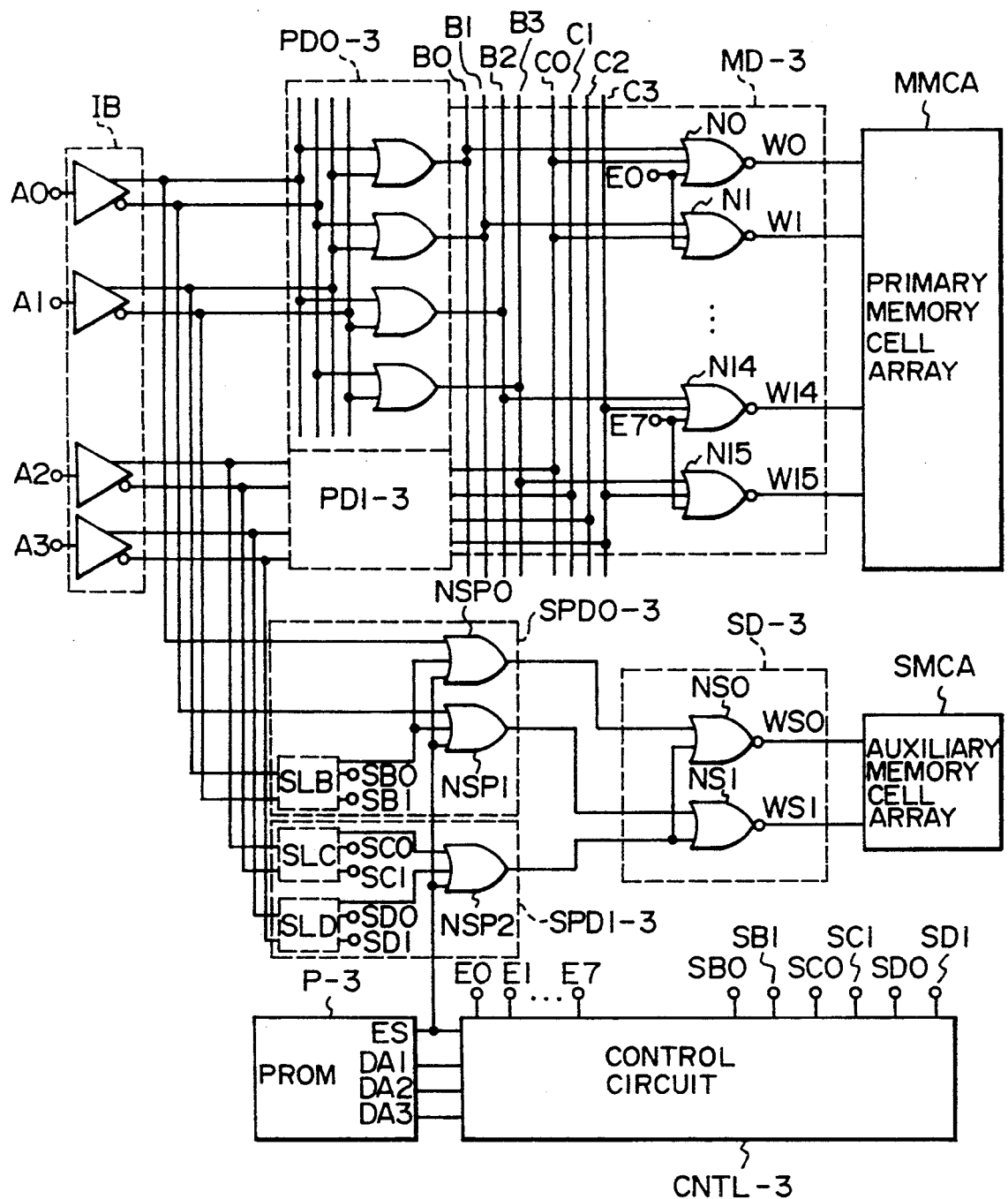
FIG. 12 is a diagram showing a modified example of the memory device shown in FIG. 3.

The embodiment of FIG. 12 shows a remedy method in the case where two word lines or bit lines become defective in pair. This embodiment is based on the embodiment shown in FIG. 3 with some changes added thereto. A first change is such that control input terminals of NOR circuits N0 to N15 forming logic circuits of a main decoder MD-3 are connected to each other two by two and a first control signal is supplied to the control input terminals. For example, the control input terminals of the NOR circuits N0 and N1 are connected to each other and the bit E0 of the first control signal is supplied to those connected terminals. Thereby, two word lines (for example, W0 and W1) are kept in an unselected condition. A second change is such that an auxiliary memory cell array SMCA and a main decoder SD-3 in an auxiliary decoder are prepared corresponding to two word lines (WS0 and WS1) and OR circuits NSP0 and NSP1 of pre-decoder SPD0-3 in the auxiliary decoder are connected with the affirmative and negative signals of the bit A0 of an address signal directly and with the bit A1 thereof through a switch circuit SLB. (In the embodiment shown in FIG. 3, the bit A0 is connected through the switch circuit SLA.)

Figure 13:
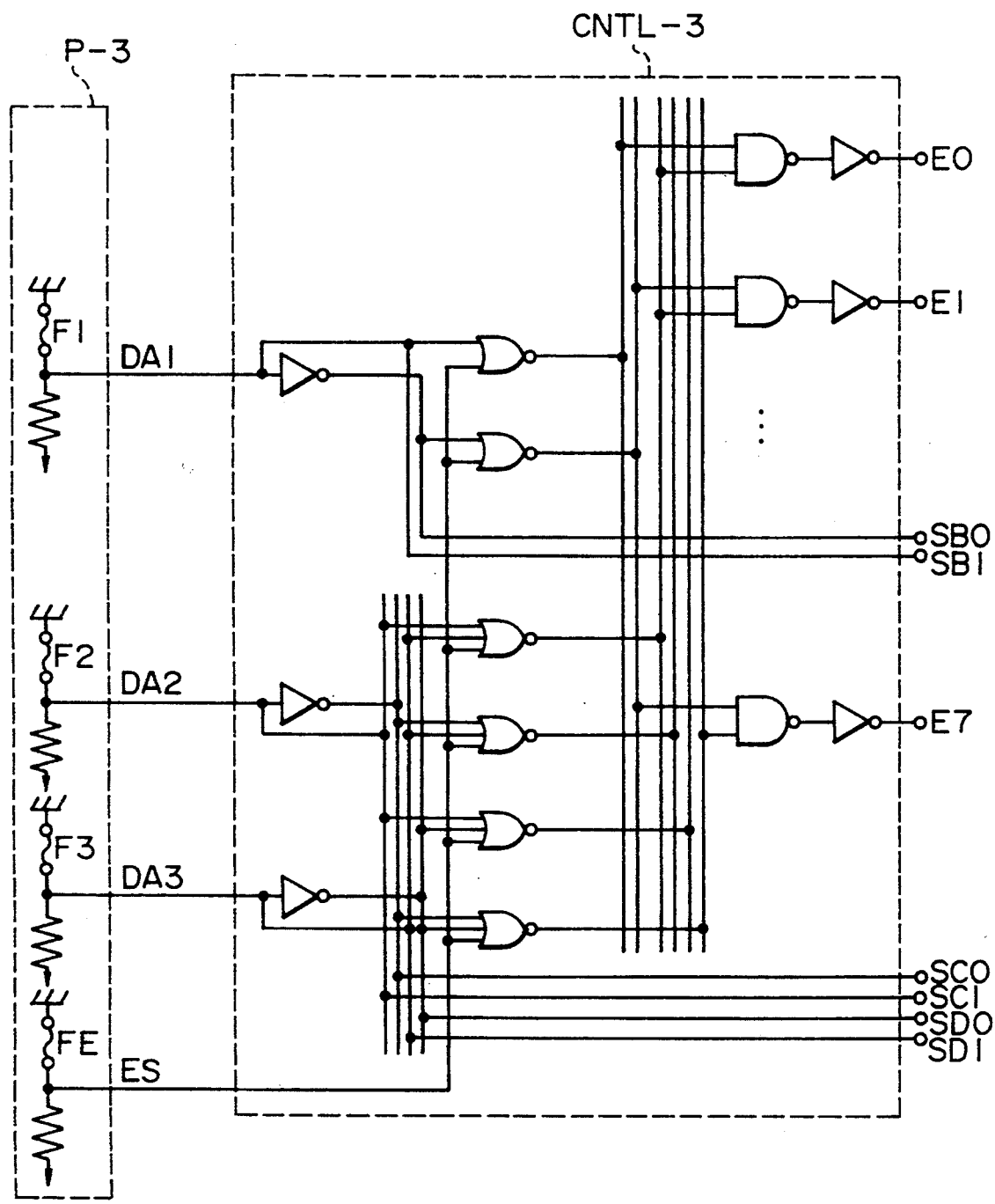
FIG. 13 is a diagram showing an example of the PROM and the control circuit which may be used in the memory device shown in FIG. 12.

Now assume that there is a defect of the short-circuiting of the word lines W0 and W1. In this case, a PROM P-3 is programmed such that a cell defect signal ES representing the presence/absence of a defective word line is "0" and a defective cell address signal DA1-DA3 indicating an address of the defective word lines W0 and W1 is "000". A control circuit CNTL-3 used in the present embodiment may be constructed, for example, as shown in FIG. 13. With this construction, there are produced the following:

| | |
|---|---|
| E0 = "1" | E1 to E7 = "0" |
| SB0 = "1" | SB1 = "0" |
| SC0 = "1" | SC1 = "0" |
| SD0 = "1" | SD1 = "0". |

Thereby, the NOR circuits N0 and N1 of the main decoder MD-3 in the primary decoder are always placed in disabled conditions and the word lines W0 and W1 are kept at a low potential. On the other hand, the OR circuit NSP0 in the pre-decoder SPD0-3 in the auxiliary decoder is supplied with the affirmative signal of the bit A0 of the address signal directly and with the affirmative signal of the bit A1 thereof through the switch circuit SLB, the OR circuit NSP1 in the pre-decoder SPD0-3 in the auxiliary decoder is supplied with the negative signal of the bit A0 of the address signal directly and with the affirmative signal of the bit A1 thereof through the switch circuit SLB, and the OR circuit NSP2 in the pre-decoder SPD1-3 in the auxiliary decoder is supplied with the affirmative signal of the bit A2 of the address signal and the affirmative signal of the bit A1 thereof through the switch circuits SLC and SLD. Therefore, when an address signal "0000" designating the word line W0 is inputted, the output of a NOR circuit NS0 of the main decoder SD-3 in the auxiliary decoder takes a high potential so that the auxiliary word line WS0 is accessed. When an address signal "0001" designating the word line W1 is inputted, the output of a NOR circuit NS1 of the main decoder SD-3 in the auxiliary decoder takes a high potential so that the auxiliary word line WS1 is accessed. As explained in the above, the present embodiment enables a remedy for the defect of the short-circuiting of two word lines or bit lines.

FIG. 13 shows an example of the PROM P-3 and the control circuit CNTL-3 which may be used in the embodiment shown in FIG. 12. In the embodiment shown in FIG. 12, the word lines or bit lines are replaced in a two-line set by the auxiliary memory cell array. Therefore, three bits DA1 to DA3 suffice for a defective cell address signal. The defective cell address signal DA1-DA3 is decoded to produce a first control signal E0-E7, and a second control signal SB0, SB1, SC0, SC1, SD0 and SD1 is obtained from an intermediate signal in the course of decoding. It is preferable that the present circuit is formed by a CMOS circuit. With the use of CMOS, it is possible to make the power consumption of the control circuit as well as the occupation area thereof very small. Also, the construction of the control circuit can be simplified in a manner similar to the embodiment shown in FIG. 5.

Figure 14:
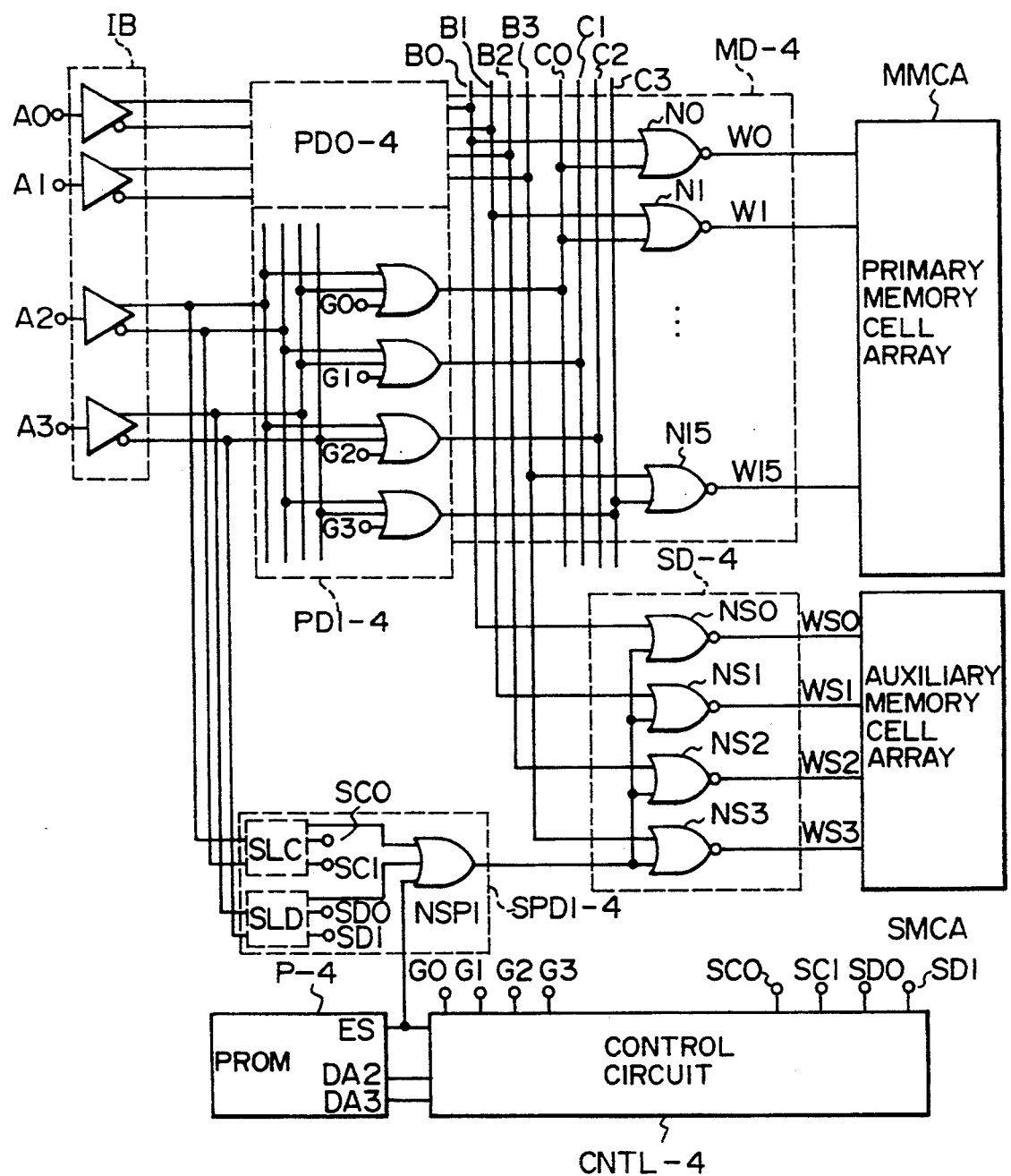
FIG. 14 is a diagram showing another modified example of the memory device shown in FIG. 3.
Figure 15:
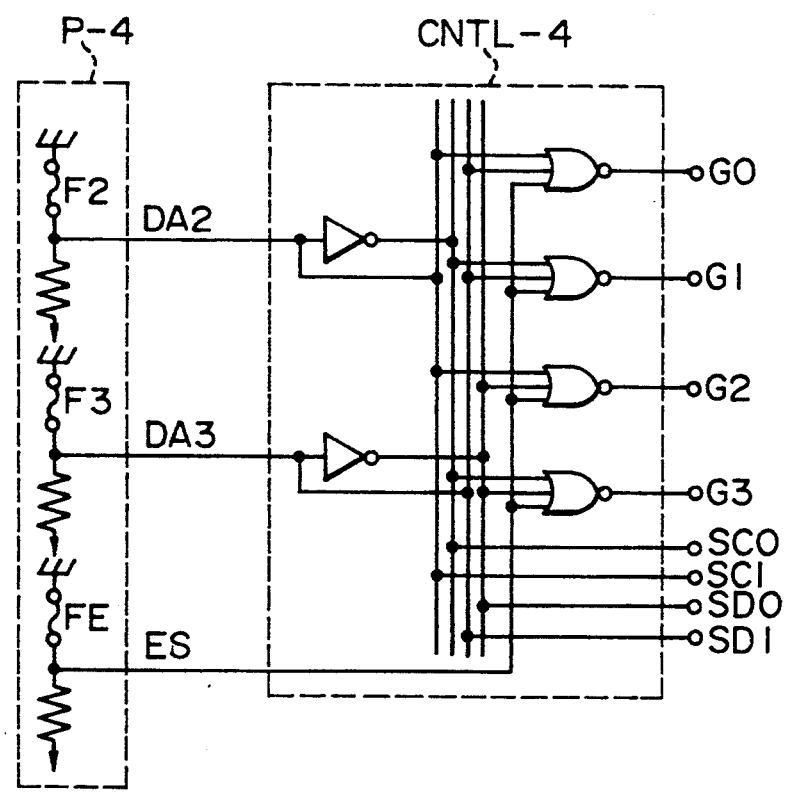
FIG. 15 is a diagram showing an example of the PROM and the control circuit which may be used in the memory device shown in FIG. 14.

FIG. 14 shows an embodiment in which four word lines are taken as one block and the word lines are replaced by auxiliary word lines in units of one block. A main decoder SD-4 in an auxiliary decoder includes four NOR circuits NS0 to NS3, and an auxiliary memory cell array SMCA4 is provided with four auxiliary word lines WS0 to WS3. A PROM P-4 and a control circuit CNTL-4 may be constructed as shown in FIG. 15. OR circuits (or first logic gate circuits) of a pre-decoder PD1-4 in a primary decoder are provided with their control input terminals which disable word lines, and a first multi-bit control signal G0-G3 is supplied to those control input terminals. Thereby, the block of four word lines can be disabled. For example, when the bit G0 of the first control signal takes a high potential, the bit C0 of a multi-bit pre-decode signal is kept at a high potential so that word lines W0 to W3 (W2 and W3 not shown) connected to the output terminals of NOR circuits N0 to N3 of NOR circuits N0 to N15 (or second logic circuits) of a main decoder MD-4 in the primary decoder is brought into an unselected condition. On the other hand, an OR circuit NSP1 of a pre-decoder SPD1-4 in the auxiliary decoder is inputted with the affirmative or negative signals of the bits A2 and A3 of an address signal through switch circuits SLC and SLD. The four NOR circuits NS0 to NS3 of the main decoder SD-4 in the auxiliary decoder are selected by those signals so that the auxiliary memory cell array SMCA4 is accessed. According to the present embodiment, since it is not necessary to provide disable terminals (or control input terminals) in that main decoder MD-4 of the primary decoder which has many circuits, an increase in area associated with the provision of the defect remedy circuit can be made small.

FIG. 15 shows an example of the PROM P-4 and the control circuit CNTL-4 which may be used in the embodiment shown in FIG. 14. In the embodiment shown in FIG. 14, the word lines or bit lines are replaced in a four-line set by the auxiliary memory cell array. Therefore, two bits DA2 and DA3 suffice for a defective cell address signal. The bits DA2 and DA3 are decoded to produce a first control signal G0-G3, and a second control signal SC0, SC1, SD0 and SD1 is obtained from a signal in the course of decoding (or an intermediate signal). It is preferable that the present circuit is formed by a CMOS circuit. With the use of CMOS, it is possible to make the power consumption of the control circuit as well as the occupation area thereof very small. Also, the construction of the control circuit can be simplified in a manner similar to the embodiment shown in FIG. 5.

According to a defect remedy circuit or a semiconductor device with controlled auxiliary decoder of the present invention mentioned above, a high speed ability is obtained. Further, the combination with memory cells using MOS transistors provides a reduced area and a high integration.

As has been mentioned in the foregoing, in the above-mentioned embodiments, a PROM having defective cell address information stored therein and a control circuit are used so that a word line or a bit line containing a defective cell is kept in an unselected condition and a bit of a multi-bit pre-decode signal (or multi-bit intermediate signal) corresponding to an address of the defective cell is connected to an input terminal of an auxiliary decoder through a switch. Namely, an access path corresponding to the defective cell address is changed from a primary decoder to the auxiliary decoder, thereby remedying the defective cell. Therefore, no address compare circuit is required. Accordingly, a time for accessing the auxiliary memory cell array has little increase as compared with a time for accessing the primary memory cell array.

We claim:

1. A semiconductor memory device comprising:
   a primary memory cell array having a plurality of memory cells arranged at crossing points between word lines and bit lines;
   a primary decoder having first circuit means for producing an intermediate signal from an address signal and second circuit means for producing a first cell selection signal from said intermediate signal for selectively driving one of said word lines and at least one of said bit lines;
   an auxiliary memory cell array having a plurality of memory cells, each being used for a defective memory cell found in said primary memory cell array;
   an auxiliary decoder connected to said primary decoder to receive said intermediate signal therefrom;
   a non-volatile memory for storing therein first information indicating that said primary memory cell array contains at least one defective memory cell and second information indicating an address of said at least one defective memory cell in said primary memory cell array, said non-volatile memory having means for producing a cell defect signal based on said first information and a defective cell address signal based on said second information, said cell defect signal being supplied to said auxiliary decoder;
   a control circuit responsive to said cell defect signal and said defective cell address signal for producing a first control signal to be supplied to said second circuit means of said primary decoder and a second control signal to be supplied to said auxiliary decoder,
   said primary decoder being prohibited by said first control signal from producing a first cell selection signal for driving at least one of a word line and a bit line associated with a defective memory cell having an address represented by said defective cell address signal, and
   said auxiliary decoder producing a second cell selection signal from said intermediate signal under control of said second control signal from said control circuit and of said cell defect signal from said non-volatile memory for selectively accessing a memory cell in said auxiliary memory cell array, said accessed memory cell in said auxiliary memory cell array being used for said defective memory cell in said primary memory cell array having an address represented by said defective cell address signal.

2. A semiconductor memory device according to claim 1, wherein
   said intermediate signal from said first circuit means in said primary decoder is a multi-bit intermediate signal having a plurality of bits, and
   said auxiliary decoder includes a switch circuit for receiving said bits of said multi-bit intermediate signal and selectively passing those of said bits of said multi-bit intermediate signal which are selected by said second control signal from said control circuit and includes auxiliary circuit means enabled by said cell defect signal from said non-volatile memory to produce said second cell selection signal from said selected bits of said multi-bit intermediate signal.

3. A semiconductor memory device according to claim 2, wherein
   said first circuit means in said primary decoder includes a pre-decoder for producing a first multi-bit pre-decode signal from said address signal, said first pre-decode signal serving as said multi-bit intermediate signal to be received by said switch circuit of said auxiliary decoder,
   said second circuit means in said primary decoder includes a main decoder for producing said first cell selection signal from said first multi-bit pre-decode signal, and
   said auxiliary circuit means of said auxiliary decoder has a circuit for receiving said selected bits of said multi-bit intermediate signal from said switch circuit to produce said second cell selection signal therefrom.

4. A semiconductor memory device according to claim 2, wherein
   said first circuit means in said primary decoder includes an input buffer for producing said multi-bit intermediate signal from said address signal,
   said second circuit means in said primary decoder includes a pre-decoder for producing a first multi-bit pre-decode signal from said multi-bit intermediate signal and a main decoder for producing said first cell selection signal from said first multi-bit pre-decode signal, and
   said auxiliary circuit means of said auxiliary decoder has a first circuit for receiving said selected bits of said multi-bit intermediate signal from said switch circuit to produce a second multi-bit pre-decode signal therefrom and a second circuit for producing said second cell selection signal from said second multi-bit pre-decode signal.

5. A semiconductor memory device according to claim 4, wherein
   said first control signal from said control circuit is a multi-bit control signal having a plurality of bits, and
   said main decoder of said second circuit means in said primary decoder includes a plurality of logic gate circuits each having an output terminal connected to a different one of said word lines or bit lines and each having decode input terminals connected to receive some of the bits of said multi-bit intermediate signal and a control input terminal connected to receive one of the bits of said first multi-bit control signal.

6. A semiconductor memory device according to claim 5, wherein each two of said logic gate circuits having their output terminals connected to adjacent two word or bit lines have their control input terminals connected to each other to receive an identical bit of said first multi-bit control signal, and said defective cell address signal represents addresses of a plurality of memory cells with which said adjacent two word or bit lines are associated.

7. A semiconductor memory device according to claim 4, wherein said control signal from said control circuit is a multi-bit control signal having a plurality of bits, said pre-decoder of said second circuit means in said primary decoder includes a plurality of first logic gate circuits each having an output terminal from which one bit of said first multi-bit pre-decode signal is delivered and each having decode input terminals connected to receive some of the bits of said multi-bit intermediate signal and a control input terminal connected to receive one of the bits of said first multi-bit control signal, and said main decoder of said second circuit means in said primary decoder includes a plurality of second logic gate circuits each having an output terminal connected to a different one of said word lines or bit lines and each having decode input terminals connected to receive some of the bits of said multi-bit intermediate signal.

* * * * *